United States Patent [19] [11] Patent Number: 4,651,109
Inoue [45] Date of Patent: Mar. 17, 1987

[54] PIEZOELECTRIC RESONANCE COMPONENT HAVING AN IMPROVED GROUP DELAY TIME CHARACTERISTIC

[75] Inventor: Jiro Inoue, Ishikawa, Japan

[73] Assignee: Murata Manufacturing Co., Ltd., Nagaokakyo, Japan

[21] Appl. No.: 711,210

[22] Filed: Mar. 13, 1985

[30] Foreign Application Priority Data

Jun. 12, 1984 [JP] Japan ................................. 59-121023
Nov. 26, 1984 [JP] Japan ........................... 54-179179[U]

[51] Int. Cl.[4] ............................................. H03H 9/13
[52] U.S. Cl. .................................... 329/117; 333/189; 333/190
[58] Field of Search ................ 329/117, 118; 455/214, 455/337; 333/187, 188, 189, 190, 191, 192, 197, 198; 310/340, 342, 348, 366

[56] References Cited

U.S. PATENT DOCUMENTS 4,398,162 8/1983 Nagai ............................... 333/190 X

FOREIGN PATENT DOCUMENTS 0010060 1/1977 Japan .................................... 329/117

Primary Examiner—Eugene R. LaRoche
Assistant Examiner—Robert J. Pascal
Attorney, Agent, or Firm—Wenderoth, Lind & Ponack

[57] ABSTRACT

A piezoelectric resonance component which in view of an equivalent circuit comprises a series arm formed by one or more resonators ($X_{s1} \ldots X_{sn}$) connected in series between input and output ends and one or more parallel arms including resonators ($X_{p1} \ldots X_{p(n-1)}$) connected to the series arm. The resonators ($X_{s1} \ldots X_{sn}$) of the series arm are connected in parallel with parallel damping resistors ($R_{s1} \ldots R_{sn}$). The resonators ($X_{p1} \ldots X_{p(n-1)}$) of the parallel arms are connected in series with series damping resistors ($R_{p1} \ldots R_{p(n-1)}$).

6 Claims, 23 Drawing Figures

PIEZOELECTRIC RESONANCE COMPONENT HAVING AN IMPROVED GROUP DELAY TIME CHARACTERISTIC

BACKGROUND OF THE INVENTION

1. Field of the Invention

The present invention relates to a piezoelectric resonance component in which damping is so performed as to improve the group delay time characteristic thereof while lowering its insertion loss.

2. Description of the Prior Art

In piezoelectric resonance components such as a piezoelectric filter and ceramic discriminators employed in an FM/PM demodulating circuit, group delay time characteristics thereof generally have been improved by mechanical damping utilizing piezoelectric materials of low Q m or elastic rubber sheets as disclosed in, e.g., Japanese Patent Laying-Open No. 20052/1980. Such mechanical damping is performed to improve phase linearity, whereas increased is equivalent resistance Re in an equivalent circuit of a piezo-resonator as shown in FIG. 2, and thus, in case of a filter, the insertion loss is increased and the signal-to-noise ratio is deteriorated as shown in FIGS. 3 and 4. FIG. 3 shows an example in which the group delay time characteristic is not improved and FIG. 4 shows an example in which the insertion loss is increased although the group delay time characteristic is improved. Such tendency is remarkable in a ladder type filter, the so-called an energy-trapping dual mode filter, three-terminal type filter utilizing a single mode of area vibration and length vibration, and the like.

Recently, a car telephone has come into wide use and the same utilizes an FM modulation system requiring a filter having an excellent group delay time characteristic and reduced insertion loss. Similar characteristics are also required in a receiving filter for AM stereo broadcasting as well as a ceramic discriminator employed in an FM/PM demodulation circuit.

SUMMARY OF THE INVENTION

Accordingly, an object of the present invention is to provide a piezoelectric resonance component which has a flat group delay time characteristic, i.e., which has a linear phase characteristic as well as reduced insertion loss.

In a broad aspect of the present invention, the piezoelectric resonance component comprises in view of an equivalent circuit a series arm formed by one or more resonators connected in series between input and output ends and one or more parallel arms including one or more resonators connected between the said series arm and a grounded side. At least one of the resonators forming the series arm is connected in parallel with one or more parallel damping resistors while at least one of the resonators forming the parallel arms is connected in series with one or more series damping resistors. According to the present invention, therefore, damping is electrically performed by connection/insertion of the damping resistors whereby a piezoelectric resonance component having an improved group delay time characteristic is obtained without increasing the insertion loss. Thus, a receiver of low distortion can be produced without deteriorating the signal-to-noise ratio and without increasing the gain or the number of stages of an amplifier.

The piezoelectric resonance component according to the present invention can be embodied as a filter such as a ladder type filter or an FM/PM discriminator.

Further, the aforementioned damping resistors may be directly provided in a case member forming the piezoelectric resonance component having an improved group delay time characteristic, or in an internal element pressing member for retaining internal elements such as resonators in the case member. In addition, the respective damping resistors may be provided on a piezoelectric plate for forming the resonators or on an insulation substrate to which the piezoelectric plate is mounted.

The above and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
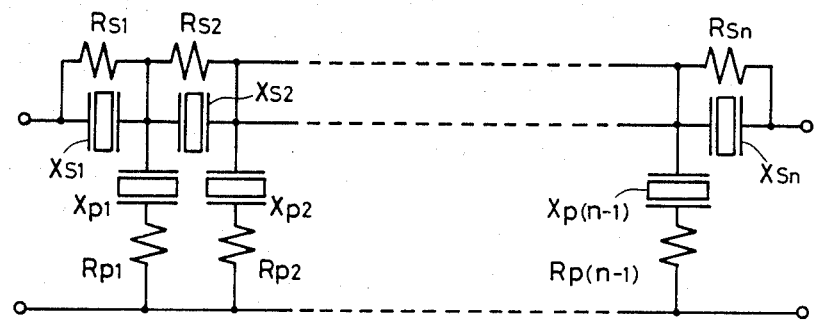
FIG. 1 is an equivalent circuit diagram of an embodiment of the present invention.
Figure 2:
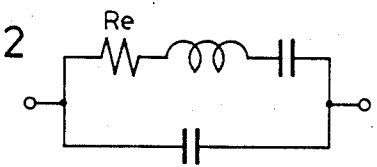
FIG. 2 is an illustration showing an equivalent circuit of a piezo-resonator.
Figure 3:
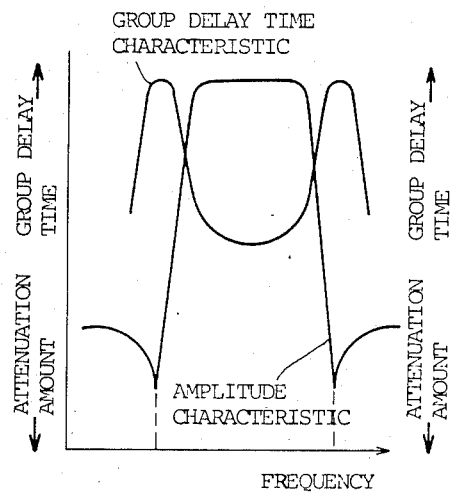
FIGS. 3 and 4 are illustrations respectively showing amplitude characteristics and group delay time characteristics in ladder type filters taken as an example of conventional piezoelectric resonance components.
Figure 4:
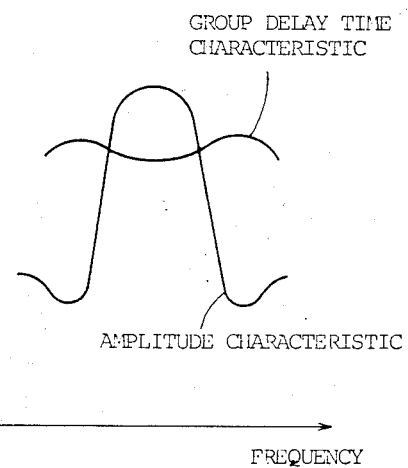

FIG. 1 is a circuit diagram showing a ladder type filter according to an embodiment of the present invention, which is structured in n−0.5 stages. Referring to FIG. 1, series resonators $X_{s1}$, $X_{s2}$, ..., $X_{sn}$ forming a series arm are respectively connected with parallel resistors $R_{s1}$, $R_{s2}$, ..., $R_{sn}$ while parallel resonators $X_{p1}$, $X_{p2}$, ..., $X_{p(n-1)}$ forming parallel arms are connected with series resistors $R_{p1}$, $R_{p2}$, ..., $R_{p(n-1)}$. Although the respective resonators shown in FIG. 1 are necessarily connected with the resistors in a series or parallel manner, the present invention is not restricted to such structure and the resonators may be connected with damping resistors only at required portions. Further, although the series resistors $R_{p1}$, $R_{p2}$, ..., $R_{p(n-1)}$ are inserted in grounded sides of the parallel resonators $X_{p1}$, $X_{p2}$, ..., $X_{p(n-1)}$ in FIG. 1, they may be inserted in hot sides.

Figure 5:
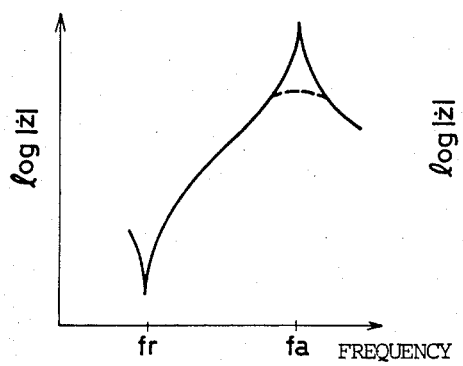
FIG. 5 illustrates an impedance curve of piezo-resonators in a series arm and FIG. 6 illustrates a phase characteristic of the piezo-resonators in the series arm.
Figure 7:
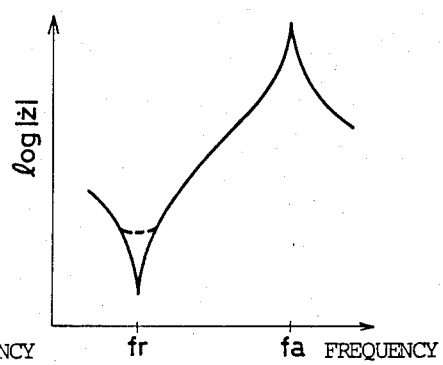
FIG. 7 illustrates an impedance curve of piezo-resonators in parallel arms and FIG. 8 illustrates a phase characteristic of the piezo-resonators in the parallel arms.
Figure 6:
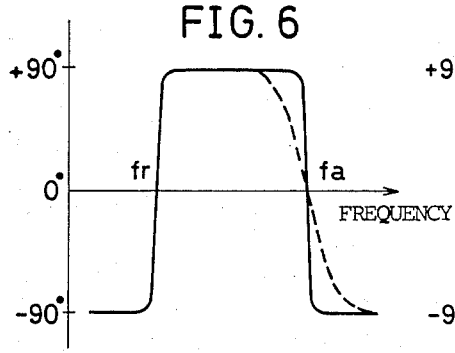
Figure 8:
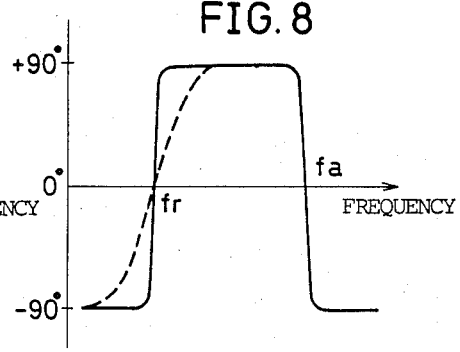

By virtue of the aforementioned circuit structure, the impedance and the phase of the series resonators $X_{s1}$, $X_{s2}$, ..., $X_{sn}$ at an antiresonance frequency $f_a$ are respectively changed as shown in FIGS. 5 and 6 from those indicated by the solid lines (before connection of the damping resistors) to those indicated by the broken lines (after connection of the damping resistors). In a similar manner, the impedance and the phase of the parallel resonators $X_{p1}$, $X_{p2}$, ..., $X_{p(n-1)}$ at an resonance frequency $f_r$ are respectively changed as shown in FIGS. 7 and 8 from those indicated by the solid lines (before insertion of the damping resistors) to those indicated by the broken lines (after insertion of the damping resistors).

Figure 9:
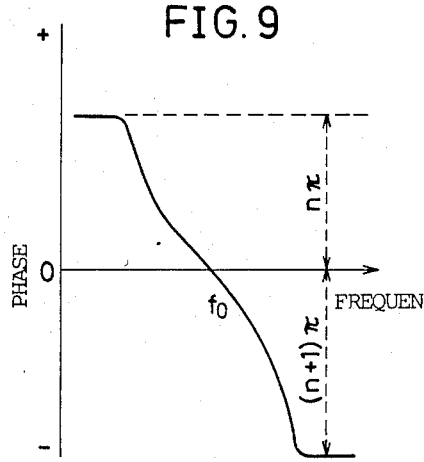
FIG. 9 is an illustration showing a phase characteristic of a ladder type filter according to the embodiment as shown in FIG. 1.
Figure 10:
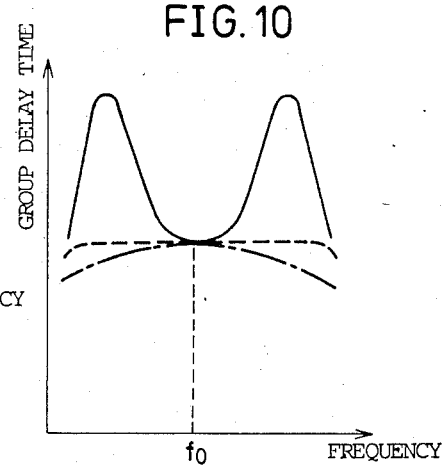
FIG. 10 shows the group delay time characteristic thereof.

In other words, the impedance and the phase of the series resonators $X_{s1}$, $X_{s2}$, ..., $X_{sn}$ at the antiresonance frequency $f_a$ and those of the parallel resonators $X_{p1}$, $X_{p2}$, ..., $X_{p(n-1)}$ at the resonance frequency $f_r$ are changed from steep curves to smooth curves. This means that the phase is changed linearly in the phase characteristic of the filter as shown in FIG. 9. In other words, the curve shown in FIG. 10 is changed from that indicated by the solid line (before connection of the resistors) to that indicated by the broken line (after connection of the resistors), i.e., the group delay time is made constant. It is to be noted here that the series resonators are connected in a parallel manner with the damping resistors while the damping resistors are inserted in a series manner in the parallel resonators, whereby the group delay time characteristic is improved without increasing the insertion loss of the filter.

When the resistance value is not within an appropriate range, no such difference is caused in comparison with the state before connection or insertion of the resistors, or the curve as shown in FIG. 10 is upwardly convexly changed to that indicated by the one-dot chain line. Further, connection or insertion of the resistors may cause deterioration of the shape factor and lowering in the maximum attenuation amount depending on the resistance value thereof. Thus, the resistance value may be set according to circumstances in order to meet users' demands.

Figure 11:
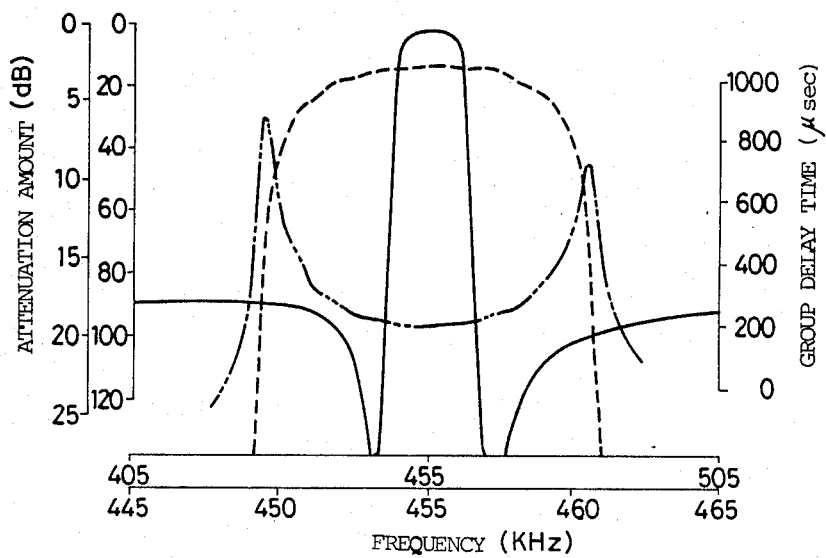
FIGS. 11 to 14 are illustrations showing actually measured characteristics of attenuation amounts and group delay times in the embodiment as shown in FIG. 1.
Figure 12:
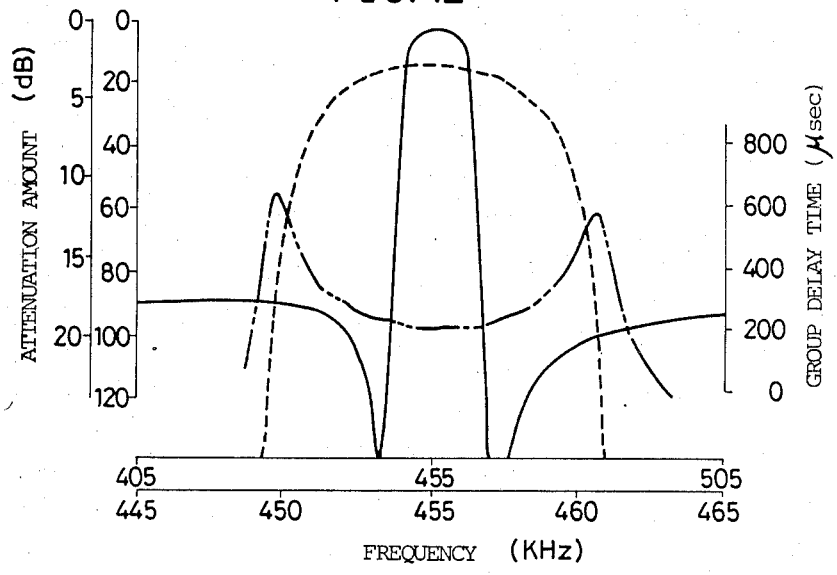
Figure 13:
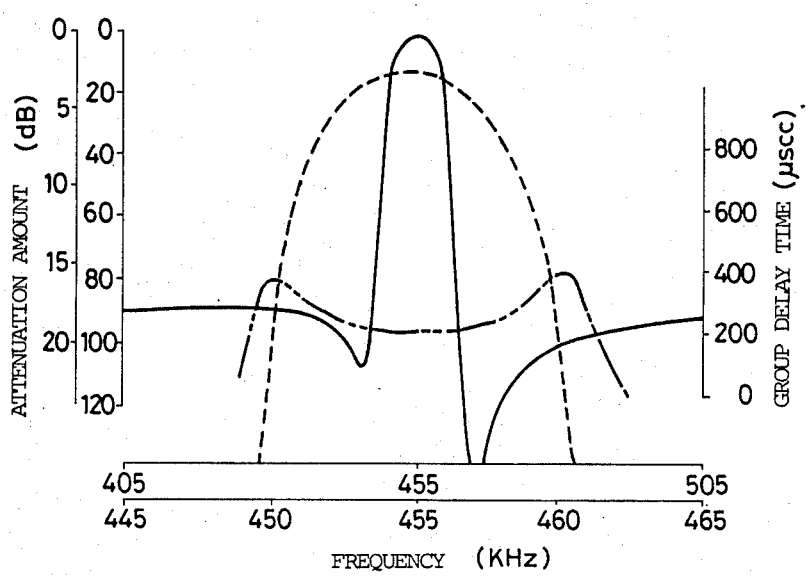
Figure 14:
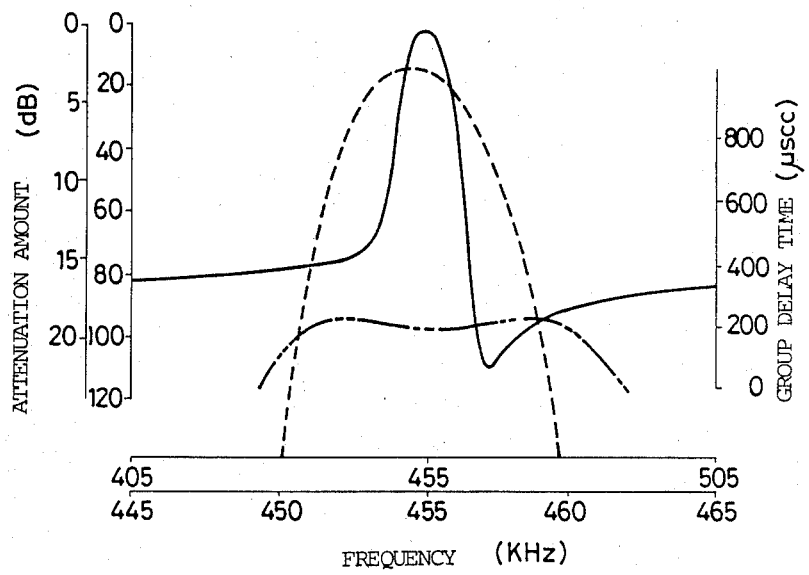

FIGS. 12 to 14 show characteristics attained in the case where the equivalent circuit as shown in FIG. 1 is applied to conventional structure having such characteristics as shown in FIG. 11, for reference. In the case of FIG. 12, the resistance value of parallel resistors $R_{s1}$, $R_{s2}$, ..., $R_{sn}$ is equal to 150 KΩ and that of series resistors $R_{p1}$, $R_{p2}$, ..., $R_{p(n-1)}$ is equal to 60Ω and, in the case of FIG. 13, the resistance value of parallel resistors $R_{s1}$, $R_{s2}$, ..., $R_{sn}$ is equal to 50 KΩ and that of series resistors $R_{p1}$, $R_{p2}$, ..., $R_{p(n-1)}$ is equal to 200Ω, while the resistance value of the parallel resistors $R_{s1}$, $R_{s2}$, ..., $R_{sn}$ is equal to 15kΩ and that of series resistors $R_{p1}$, $R_{p2}$, ..., $R_{p(n-1)}$ is equal to 600Ω in the case of FIG. 14.

In FIGS. 11 through 14, the broken lines indicate enlarged characteristics of those indicated by the solid lines, and two-dot chain lines indicate group delay time characteristics.

Figure 15:
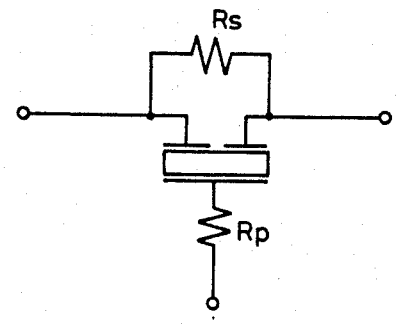
FIG. 15 is an equivalent circuit diagram of another embodiment of the present invention.

FIG. 15 is a circuit diagram in which the present invention is applied to the so-called three-terminal type filter, an energy-trapping type dual mode filter or a ceramic discriminator such as that for a quadrature type demodulation circuit whose phase characteristic is particularly important. In view of an equivalent circuit, a damping resistor is present in a portion corresponding to a series arm in a parallel manner with the series arm and a damping resistor is present in a portion corresponding to parallel arms in a series manner with the parallel arms, whereby the group delay time characteristic is improved without increasing the insertion loss similarly to the aforementioned ladder type filter.

Description is now made on examples of various constructions for embodying the resistors according to the aforementioned embodiments in products.

In case of an energy-trapping type filter, resistance films may be provided in dead spaces on a piezoelectric plate. Or, such resistance films may be provided on a substrate to which a piezoelectric plate is mounted. In case of a non-energy-trapping type filter, opposing electrodes are connected with each other by resistance films in vibration node portions of the piezoelectric plate, e.g., at the central portions in case of square plates in case of a expansion vibration mode being utilized, thereby to embody the resistors connected in parallel with series arms. The resistors to be inserted in a series manner in parallel arms may be implemented by forming vibration electrode films of the piezoelectric plate by resistant materials. Further, terminal plates, which are pressed against the vibration electrode films provided in the piezoelectric plate for connecting the vibration electrode films with the exterior as well as retaining piezo-resonators, themselves may be formed by resistant materials. Also, there is a ladder type filter such as that implemented in ladder structure by formation of connection patterns on inner and outer surfaces of a base portion of a case member thereof. In such a case, single resistant elements (preferably in the form of chips) may be mounted on the patterns, or resistance films may be formed with the connection patterns. Further, chip resistors may be applied to or resistance patterns may be formed in a stopping plate covering the opening of a case member for preventing projection of elements contained in the case member such as piezo-resonators, terminal plates, insulation spacers and spring plates, as an example of the structure of a ladder type filter.

Figure 16:
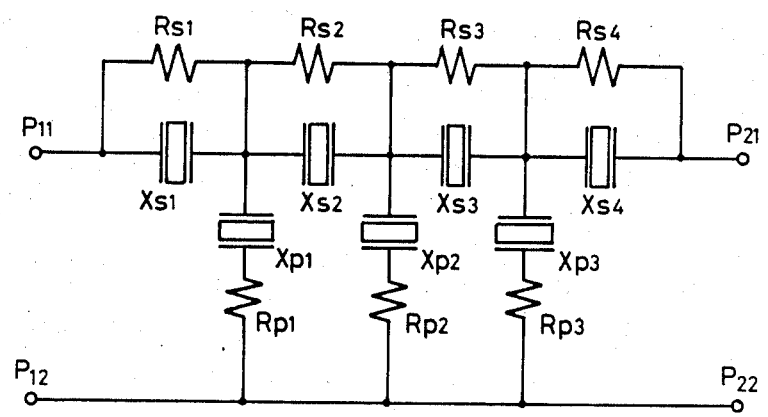
FIG. 16 is an equivalent circuit diagram of still another embodiment of the present invention.
Figure 17:
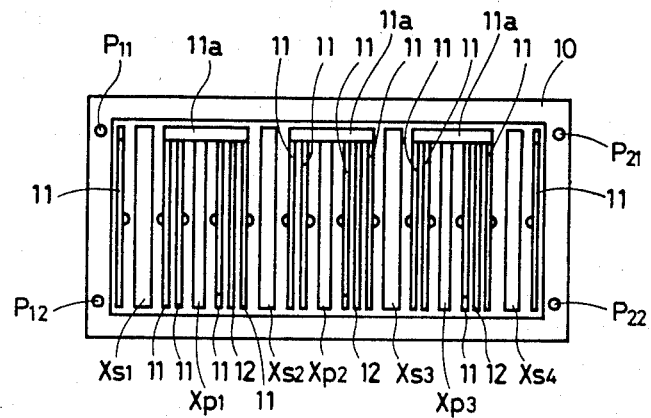
FIG. 17 is a plan view roughly illustrating an example of internal structure of a ladder type filter implemented according to the present invention.
Figure 18:
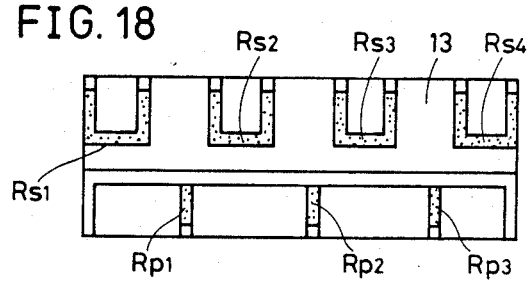
FIG. 18 is a plan view showing an example of a pressure plate employed for the structure as shown in FIG. 17.

A definite example of such structure is now described with reference to FIG. 16, which shows a ladder type filter of 3.5 stages. FIG. 17 roughly illustrates the interior of a case member of the filter in plan view. In these drawings, internal elements are shown in spaces with some parts being omitted for ready understanding of the present invention. With reference to FIGS. 16 and 17, numeral 10 indicates a case member, numeral 11 indicates various types of terminal plates and numeral 12 indicates insulation plates. The terminal plates 11 are adapted to connect series resonators $X_{s1}$ and $X_{s2}$, $X_{s2}$ and $X_{s3}$ and $X_{s3}$ and $X_{s4}$ respectively with each other, and are integrally formed with coupling portions 11a. An input pin $P_{11}$ is connected with its adjacent terminal plate 11, while an output pin $P_{21}$ is connected with its adjacent terminal plate 11. A stopping plate 13 is provided with resistance films or elements $R_{s1}$ to $R_{s3}$ and $R_{p1}$ to $R_{p3}$ and conductive or terminal electrode films for connecting the same. The stopping plate 13 thus structured is adapted to cover an opening portion of the case member 10, thereby to connect the terminal plates 11 and 11 present on both sides of the series resonator $X_{s1}$ and both end electrodes of the resistor $R_{s1}$. In a similar manner, the terminals 11 and 11 present on both ends of the series resonator $X_{s2}$ are connected with both end electrodes of the resistor $R_{s2}$ and the terminal plates 11 and 11 present on both ends of the series resonator $X_{s3}$ are connected with both end electrodes of the resistor $R_{s3}$, while the terminal plates 11 and 11 present on both ends of the series resonator $X_{s4}$ are connected both end electrodes of the resistor $R_{s4}$. Both ends of conductive patterns for coupling respective one end of the resistors $R_{p1}$ to $R_{p3}$ are connected with an input-side ground pin $P_{12}$ and an output-side ground pin $P_{22}$ respectively. Further, a non-grounded side electrode of the resistor $R_{p1}$ is connected with the grounded side terminal plate 11 of the parallel resonator $X_{p1}$. Similarly, a non-grounded side electrode of the resistor $R_{p2}$ is connected with the grounded side terminal plate 11 of the parallel resonator $X_{p2}$ and a non-grounded side electrode of the resistor $R_{p3}$ is connected with the grounded side terminal plate 11 of the parallel resonator $X_{p3}$, to be in the state of connection as shown in FIG. 16.

Figure 19:
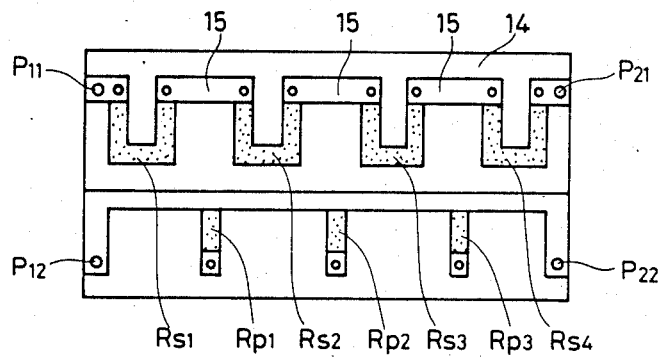
FIG. 19 is a plan view showing another example of the pressure plate applied to the internal structure as shown in FIG. 17.

FIG. 19 shows another example of a pressure plate 14 which facilitates connection of an input pin $P_{11}$ and an output pin $P_{21}$ with relevant terminal plates as well as facilitating connection of an input-side ground pin $P_{12}$ and an output-side ground pin $P_{22}$ with conductive patterns of the stopping plate, and requires no provision of terminal plates having coupling portions 11a.

In other words, the stopping plate 14 as shown in FIG. 19 is characterized in conductive patterns provided with conductive layers 15, which are substituted for the coupling portions of the terminal plates 11, and extended toward the pins $P_{11}$, $P_{12}$, $P_{21}$ and $P_{22}$. Although holes are formed in the structure of FIG. 19 for receiving connecting portions of the respective pins $P_{11}$, $P_{12}$, $P_{21}$ and $P_{22}$ and the respective terminal plates 11, these holes may be replaced by slits or recesses formed in side portions. Further, provision of the resistors is not restricted to one surface of the stopping plate 14, and may be divided in both surfaces thereof. In addition, the resistors may be provided in a plurality of stopping plates.

Figure 20:
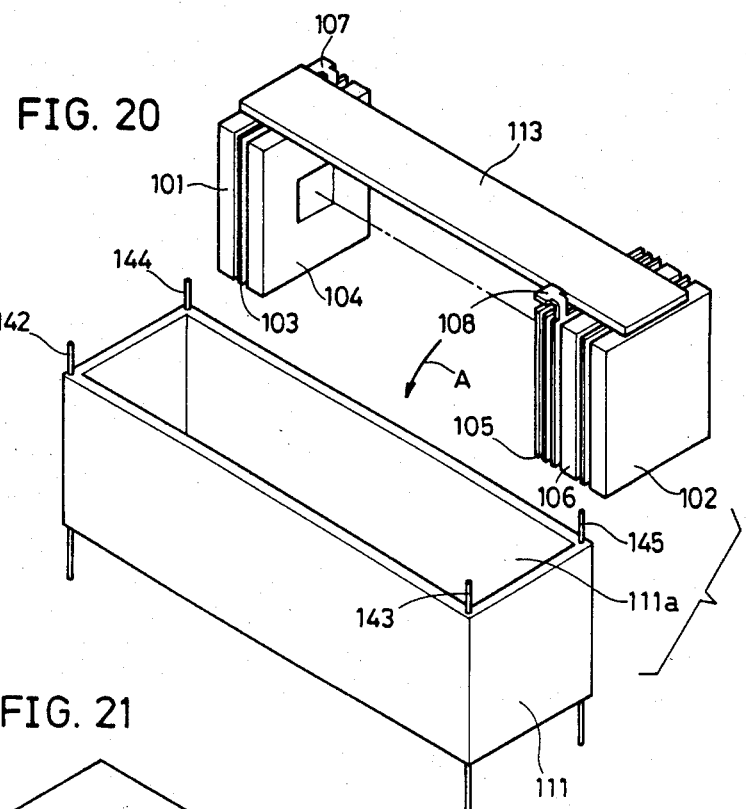
FIG. 20 is a perspective view for illustrating definite structure of the ladder type filter according to the embodiment of the present invention.

FIG. 20 is a perspective view for illustrating an example of definite structure according to the embodiment as shown in FIG. 1.

Referring to FIG. 20, internal elements including insulation plates 103 and 105 and resonators 104 and 106 are held between pressing members 101 and 102 of silicon rubber to be contained in a case member 111 having an opening 111a, as indicated by an arrow A. The case member 111 may be formed by an insulating material such as synthetic resin.

An insulation substrate 113 is placed over the internal elements thus contained in the case member 111 so as to extend along the direction of arrangement of the respective resonators 104 and 106 and the insulation plates 103 and 105 etc. forming the internal elements thereby to cover the same. The internal elements formed by the insulation plates 103 and 105 and the resonators 104 and 106 etc. may be structured by members similar to those of the conventional ladder type filter. This is because the insulation substrate 113 covering the same is formed with respective damping resistors as shown in the equivalent circuit diagram of FIG. 1, as hereinafter described.

The insulation substrate 113 is provided on its upper surface, i.e., the surface not in contact with the internal elements, with desired conductive patterns in addition to the aforementioned damping resistors. Formation of such conductive patterns is described with reference to FIGS. 22 and 23.

Figure 22:
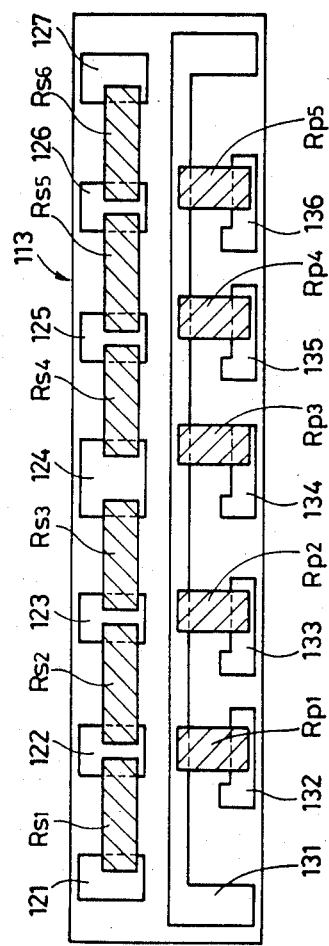
FIG. 22 is a plan view of an insulation substrate employed in the structure as shown in FIG. 20.

FIG. 22 is a plan view of the insulation substrate 113, on which patterns corresponding to the damping resistors $R_{s1}$, $R_{s2}$, ..., $R_{sn}$ to be inserted in a parallel manner in the series resonators $X_{s1}$, $X_{s2}$, ..., $X_{sn}$ (see FIG. 1) are interconnected by conductive patterns 121 to 127 similarly formed on the insulation substrate 113. The patterns as shown in FIG. 22 are indicated by symbols identical to those of the damping resistors, though, n is equal to 6 in this case. Similarly, series damping resistors $R_{p1}$ to $R_{p5}$ to be inserted in a series manner in parallel resonators $X_{p1}$ to $X_{p(n-1)}$ are formed on the insulation substrate 113 to be connected with a longitudinal conductive pattern 131 and other conductive patterns 132 to 136.

In the respective conductive patterns as shown in FIG. 22, the pattern 121 is connected to an input terminal and the pattern 127 is connected to an output terminal, while the pattern 131 is connected to ground terminals at both sides thereof. Connection between these conductive patterns and the respective terminals is hereinafter described in detail.

The conductive patterns 121 to 127 and 132 to 136 respectively connected with the damping resistors $R_{s1}$ to $R_{s6}$ and $R_{p1}$ to $R_{p5}$ are electrically connected with terminals extending from the internal elements such as those indicated by reference numerals 107 and 108 in FIG. 20 when the insulation substrate 113 is arranged on the internal elements, as obvious from FIG. 20. The terminals extending from the internal elements, such as the terminals 107 and 108 as shown in FIG. 20, are so arranged to be in contact with the side surfaces of the insulation substrate 113, i.e., the insulation substrate 113 is prepared in such width that the terminals 107 and 108 can be electrically connected with desired conductive patterns by, e.g., solder. The said connection may also be performed by conductive paint or rubber. In the embodiment as shown in FIG. 22, thus, the insulation substrate 113 is in advance provided on its upper surface with the damping resistors $R_{s1}$ to $R_{s6}$ and $R_{p1}$ to $R_{p5}$, the respective conductive patterns 121 to 127 and 132 to 136 and the conductive pattern 131 forming grounded-side wiring, whereby the damping resistors $R_{s1}$ to $R_{s6}$ and $R_{p1}$ to $R_{p5}$ can easily and securely be connected with the internal elements without increasing the number of the individual elements.

Figure 23:
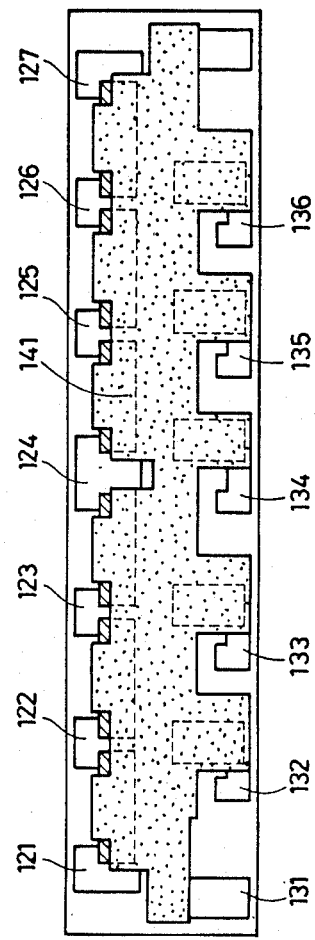
FIG. 23 is a plan view showing a state in which a protective coating layer is provided on the upper surface of the insulation substrate as shown in FIG. 22.

In addition to the conductive patterns 121 to 136 and the resistors $R_{s1}$ to $R_{s6}$ and $R_{p1}$ to $R_{p5}$ as shown in FIG. 22, a protective coating layer 141 is formed thereover in practice on the upper surface of the insulation substrate 113, as shown in FIG. 23 in plan view. The insulation substrate 113 is placed on the internal elements in the aforementioned manner upon formation of the protective coating layer 141. The protective coating layer 141 is made of an insulating material such as synthetic resin, and is adapted to prevent short circuits between the respective conductive patterns 121 to 136 while protecting the resistors $R_{s1}$ to $R_{s6}$ and $R_{p1}$ to $R_{p5}$ from damage.

Referring again to FIG. 20, the internal elements contained in the case member 111 are electrically connected with the respective damping resistors $R_{s1}$ to $R_{s6}$ and $R_{p1}$ to $R_{p5}$ formed on the insulation substrate 113 in the aforementioned manner. Embedded in the corner portions of the case member 111 are ground terminals 142 and 143, an input terminal 144 and an output terminal 145, respective both ends of which project upwardly and downwardly from the case member 111 as shown in FIG. 20. Therefore, when the insulation substrate 113 is placed on the internal elements contained in the case member 111 in the aforementioned manner, the ground terminals 142 and 143 and the input and output terminals 144 and 145 are directly connected with the aforementioned required conductive patterns 121, 127 and 131 (see FIG. 22).

Figure 21:
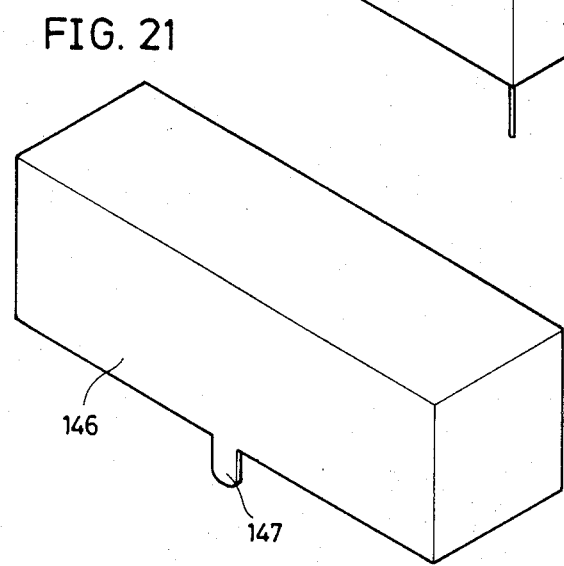
FIG. 21 is a perspective view showing an outer case member employed in the structure as shown in FIG. 20.

After the internal elements contained in the case member 111 are completely connected with the damping resistors and the terminals respectively, for example, an insulation tape is wound around the case member 111, e.g., perpendicularly to the longitudinal direction of the insulation substrate 113, thereby to integrally connect the case member 111 and the internal elements with the insulation substrate 113. Thereafter the integrally connected substance is covered by an outer case member 146 such as that shown in FIG. 21 from above the insulation substrate 113. Further, a resin material is injected into an opening portion of the outer case member 146 to close the opening portion, which is, though not clearly shown in FIG. 21, formed in the side provided with a projection 147, whereby a ladder type filter according to the embodiment of the present invention is obtained.

In the aforementioned embodiment, the respective damping resistors are interconnected with each other and electrically connected with the internal elements. Therefore, even if series or parallel damping resistors $R_{p1}$ to $R_{p(n-1)}$ or $R_{s1}$ to $R_{sn}$ are added to the conventional ladder type filter as shown in the equivalent circuit diagram of FIG. 1, conventional internal elements and case member can be employed as they are without substantially increasing the number of components and without requiring complicated connection. Particularly, although the conventional ladder type filter is provided over the internal elements with a rodlike stopper extended along the direction of arrangement of the internal elements and engaged with the case member 111 thereby to prevent projection of the internal elements, the insulation substrate 113 is provided in a space in which the rodlike stopper has been arranged, and hence the size of the ladder type filter according to the present invention is not increased in comparison with that of the conventional one. Further, although the ground terminals of the input and output sides must be connected with the grounded sides of the respective damping resistors $R_{p1}$ to $R_{p5}$ in the ladder type filter according to the present invention as obvious from FIG. 1, the same connection in the grounded sides are performed by the conductive pattern 131 as shown in FIG. 22 on the insulation substrate 113 according to the embodiment, and hence no long lead wires etc. are required for the connection.

Although the respective damping resistors $R_{s1}$ to $R_{s6}$ and $R_{p1}$ to $R_{p5}$ are formed on one surface of the insulation substrate 113 in the aforementioned embodiment, such damping resistors may be divided to be formed on both major surfaces of the insulation substrate 113. Further, the respective damping resistors may be provided on a plurality of insulation substrates. In other words, the insulation substrate 113 may be divided in plural.

Although the present invention has been described and illustrated in detail, it is clearly understood that the same is by way of illustration and example only and is not to be taken by way of limitation, the scope of the present invention being limited only by the terms of the appended claims.

What is claimed is:

1. A piezoelectric resonance component having an improved group delay time characteristic comprising:
   an input terminal and an output terminal and a common terminal;
   a plurality of first circuits connected in series between said input and output terminals, each of said first circuits comprising a piezoelectric resonator connected in parallel with a damping resistor;
   a plurality of second circuits each comprising a piezoelectric resonator connected in series with a damping resistor;
   wherein said plurality of second circuits are each respectively connected between said common terminal and a node formed between two of said plurality of first circuits;
   wherein said piezoelectric resonance component is a ladder type filter;
   and wherein said damping resistors are provided in an internal element stopping member for retaining internal elements including respective said resonators and terminal plates in a case member.

2. A piezoelectric resonance component having an improved group delay time characteristic comprising:
   an input terminal and an output terminal and a common terminal;
   a plurality of first circuit connected in series between said input and output terminals, each of said first circuits comprising a piezeoelectric resonator connected in parallel with a damping resistor;
   a plurality of second circuits each comprising a piezoelectric resonator connected in series with a damping resistor;
   wherein said plurality of second circuits are each respectively connected between said common terminal and a node formed between two of said plurality of first circuits;
   and wherein said damping resistors are provided on a piezoelectric plate forming said resonators.

3. A piezoelectric resonance component having an imporved group delay time characteristic in accordance with claim 2, wherein said damping resistors are provided on an insulation substrate to which said piezoelectric plate is mounted.

4. A piezeoelectric resonance component having an improved group delay time characteristic comprising:
   an input terminal and an output terminal and a common terminal;
   a plurality of first circuits connected in series between said input and output terminals, each of said first circuits comprising a piezoelectric resonator connected in parallel with a damping resistor;

a plurality of second circuits each comprising a piezoelectric resonator connected in series with a damping resistor;

wherein said plurality of second circuits are each respectively connected between two of said plurality of first circuits;

wherein said piezoelectric resonance component is a ladder type filter;

and wherein said ladder type filter comprises:

internal elements including respective said resonators and terminal plates;

a case member retaining said internal elements and having an opening, and an insulation substrate provided at the side of said opening of said case member retaining said internal elements for covering said internal elements and extending along the direction of arrangement of said internal elements;

said insulation substrate being provided on its major surface with respective said damping resistors, conductive patterns for connecting respective said damping resistors with respective said internal terminals and a conductive pattern for performing grounded side connection.

5. A piezoelectric resonance component having an improved group delay time characteristic in accordance with claim 4, wherein said insulation substrate is further formed on its major surface with a protective coating layer over said respective damping resistors, said conductive patterns for connecting respective said damping resistors with respective said internal elements and said conductive pattern for performing said grounded side connection.

6. A piezoelectric resonance components having an improved group delay time characteristic in accordance with claim 4, wherein said damping resistors, said conductive patterns for connecting said damping resistors with respective said internal elements and said conductive pattern for performing said ground side connection are provided on both major surfaces of said insulation substrate.

* * * * *